United States Patent
Fry

[19]

[11] Patent Number: 6,049,256
[45] Date of Patent: Apr. 11, 2000

[54] LOW PROFILE OVENIZED OSCILLATOR PACKING HAVING A HIGH THERMAL CONDUCTIVITY SUBSTRATE

[75] Inventor: Steven J. Fry, Carlisle, Pa.

[73] Assignee: CTS Corporation

[21] Appl. No.: 09/150,825

[22] Filed: Sep. 10, 1998

[51] Int. Cl.⁷ .............................. H03B 5/04; H03B 5/32; H01L 41/053
[52] U.S. Cl. ..................... 331/69; 331/68; 331/108 D; 331/158; 310/343; 310/344
[58] Field of Search .................. 331/66, 68, 69, 331/70, 108 D, 116 R, 116 FE, 158, 176; 310/315, 318, 341–344

[56] References Cited

U.S. PATENT DOCUMENTS

| | | |
|---|---|---|
| 3,931,388 | 1/1976 | Hafner et al. . |
| 4,266,157 | 5/1981 | Peters . |
| 4,453,104 | 6/1984 | Rapps et al. . |
| 4,471,259 | 9/1984 | Stoermer et al. . |
| 4,524,497 | 6/1985 | Rapps et al. . |
| 4,750,246 | 6/1988 | Pollard . |
| 4,985,655 | 1/1991 | Jensik et al. . |
| 5,025,228 | 6/1991 | Gerard et al. ............................ 331/69 |
| 5,041,800 | 8/1991 | Long et al. ............................. 331/69 |
| 5,250,870 | 10/1993 | Fenlon et al. . |
| 5,382,929 | 1/1995 | Inao et al. . |
| 5,430,345 | 7/1995 | Takahashi . |
| 5,438,219 | 8/1995 | Kotzan et al. .......................... 257/469 |
| 5,568,006 | 10/1996 | Luff et al. . |
| 5,640,746 | 6/1997 | Knecht et al. . |
| 5,696,422 | 12/1997 | Hanson et al. . |
| 5,729,181 | 3/1998 | Cutler et al. ............................ 331/69 |
| 5,952,894 | 9/1999 | Fukiharu ................................ 331/176 |

Primary Examiner—David Mis
Attorney, Agent, or Firm—Mark P. Bourgeois

[57] ABSTRACT

A low profile integrated oscillator operable to provide an oscillator signal includes a substrate having a cavity and a via passing through the substrate. A crystal or other resonator is disposed in the cavity and stabilizes the oscillator signal. An electrical circuit means is mounted to the substrate and electrically connects to the via to condition the oscillator signal. A cover seals the resonator in the cavity. A connector electrically connects the resonator to the via. A heater is mounted to the substrate to elevate the oscillator temperature and a temperature sensor is mounted to the substrate to monitor and control the oscillator temperature. The substrate is surrounded by an insulation and mounted within a housing. The housing has a connection means for connecting to an external electrical circuit.

4 Claims, 3 Drawing Sheets

LOW PROFILE OVENIZED OSCILLATOR PACKING HAVING A HIGH THERMAL CONDUCTIVITY SUBSTRATE

BACKGROUND OF THE PREFERRED EMBODIMENT(S)

1. Field of the Preferred Embodiment(s)

This invention generally relates to oscillators which provide a stable reference source or frequency in computers or other electronic equipment. Specifically, there is a low profile integrated oscillator assembly that is capable of mounting in electronic systems of constrained space requirements.

2. Description of the Related Art

Various devices are well known for providing a reference frequency or source such devices are called oscillators. The oscillator typically has a quartz crystal source and also has electronic compensation circuitry to stabilize the output frequency. Ovenized oscillators heat the oscillator to a uniform temperature to obtain a more stable output. The oscillators have been packaged on various support structures and in housings such as metal cans. Current low profile ovenized crystal oscillators typically have a height of about one-half inch. The height is typically limited by the size of the holder or can which must be used to enclose the quartz crystal. The size requirements for electronic components are decreasing and at the same time circuit densities are required to increase, especially for portable electronics.

Despite the advantages of the prior art oscillators, none have allowed the user to both stably control the frequency and temperature response and be mounted in low profile applications.

Additionally, the prior art devices have been difficult to incorporate into low profile applications such as notebook computers.

DESCRIPTION OF RELATED ART

Examples of patents related to the present invention are as follows, wherein each patent is herein incorporated by reference for related and supporting teachings:

U.S. Pat. No. 4,985,655, is a crystal header package.

U.S. Pat. No. 4,750,246, is a method of making compensated crystal oscillator.

U.S. Pat. No. 5,696,422, is a crystal package.

U.S. Pat. No. 4,266,157, is a piezoelectric resonator assembly with thin molybdenum mounting clips.

U.S. Pat. No. 3,931,388, is a crystal resonator housing configuration.

U.S. Pat. No. 4,453,104, is a low profile crystal package with an improved crystal mounting arrangement.

U.S. Pat. No. 4,471,259, is a crystal package for a high G environment.

U.S. Pat. No. 4,524,497, is a method of making a low profile crystal package with an improved crystal mounting method.

U.S. Pat. No. 5,041,800, is a lower power oscillator with heated resonators with dual mode or other temperature sensing possibly with an insulative support structure disposed between the resonator and a resonator enclosure.

U.S. Pat. No. 5,250,870, is an ultra thin surface mount crystal package.

U.S. Pat. No. 5,382,929, is a monolithic crystal filter.

U.S. Pat. No. 5,568,006, is a surface mount crystal package with receptacle mounting.

U.S. Pat. No. 5,430,345, is a piezoelectric device.

U.S. Pat. No. 5,640,746, is a method of hermetically encapsulating a crystal oscillator using a thermoplastic shell.

The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicants' claimed invention.

SUMMARY OF THE PREFERRED EMBODIMENT(S)

It is a feature of the invention to provide a low profile integrated oscillator assembly for generating an oscillator signal that provides a stable frequency over a temperature range.

A further feature of the invention is to provide a low profile integrated oscillator operable to provide an oscillator signal which includes a substrate having a cavity and one or more vias passing through the substrate. A crystal or other resonator is disposed in the cavity and can stabilize the oscillator signal. An electrical circuit means is mounted to the substrate and electrically connects to the vias to condition the oscillator signal. A cover seals the resonator in the cavity.

A connector electrically connects the resonator to the vias. The substrate has a first and second dielectric with a core located between the first and second dielectric. The core is preferably formed from a metal. The dielectric is preferably a ceramic material. The electrical circuit means are mounted on the first dielectric. A heater is mounted to the substrate to elevate the oscillator temperature and a temperature sensor is mounted to the substrate to monitor and control the oscillator temperature. The substrate is surrounded by a thermal insulation and mounted within a housing. The housing has a connection means for connecting to an external electrical circuit.

A further feature of the invention is to provide a low cost, easily assembled oscillator assembly.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Figure 1:
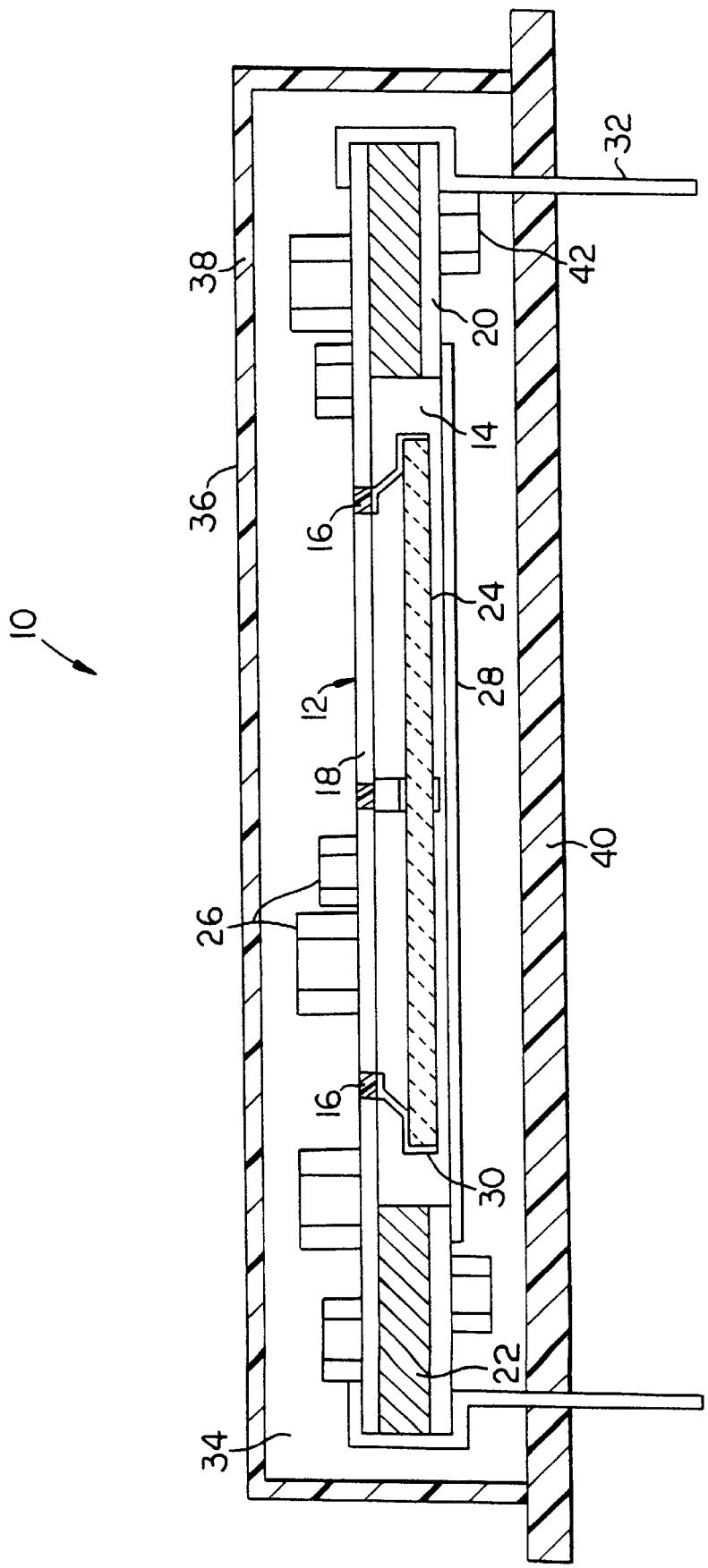
FIG. 1 is a side cross sectional view of a low profile integrated oscillator.

Referring to FIG. 1, a side cross sectional view of a low profile integrated oscillator is shown. Low profile integrated oscillator assembly 10 includes a planar substrate 12 having a recessed cavity 14 and cylindrical vias 16 passing through substrate 12. Substrate 12 has a first dielectric 18 a second dielectric 20 and a core 22 located between the first 18 and second 20 dielectric. Core 22 is preferably formed from a thermally conductive material such as copper. Dielectrics 18 and 20 are preferably a ceramic material such as alumina. Dielectrics 18 and 20 are bonded to core 22 by a suitable adhesive (not shown).

Resonator 24 is disposed in cavity 14 and stabilizes the oscillator signal. The resonator can be a rectangular strip crystal of quartz or other materials or it can be a surface acoustic wave device or it can be an inverted mesa crystal. A conventional oscillator electrical circuitry 26 is mounted to dielectric 18 and electrically connected to via 16 by conventional circuit lines (not shown) on dielectric 18. Electrical circuit 26 conditions the oscillator signal. A metal cover 28 hermetically seals crystal 24 in cavity 14. Cover 28 can be fastened to dielectric 20 by an adhesive or can be soldered or welded.

A connector 30 electrically connects crystal 24 to via 16. Connector 30 also spaces crystal 24 from dielectric 18. Pins 32 electrically connect the circuitry 26 to other external electrical circuits (not shown). Substrate 12 in an ovenized application is surrounded by insulation 34 and mounted within a housing 36. Housing 36 has a top can 38 and a bottom piece 40 such as a printed circuit board. Pins 32 pass through bottom piece 40.

It is understood that assembly 10 can be used without housing 36 and insulation 34, if an ovenized oscillator is not required. Substrate 12 can be directly mounted to another printed circuit board.

Figure 2:
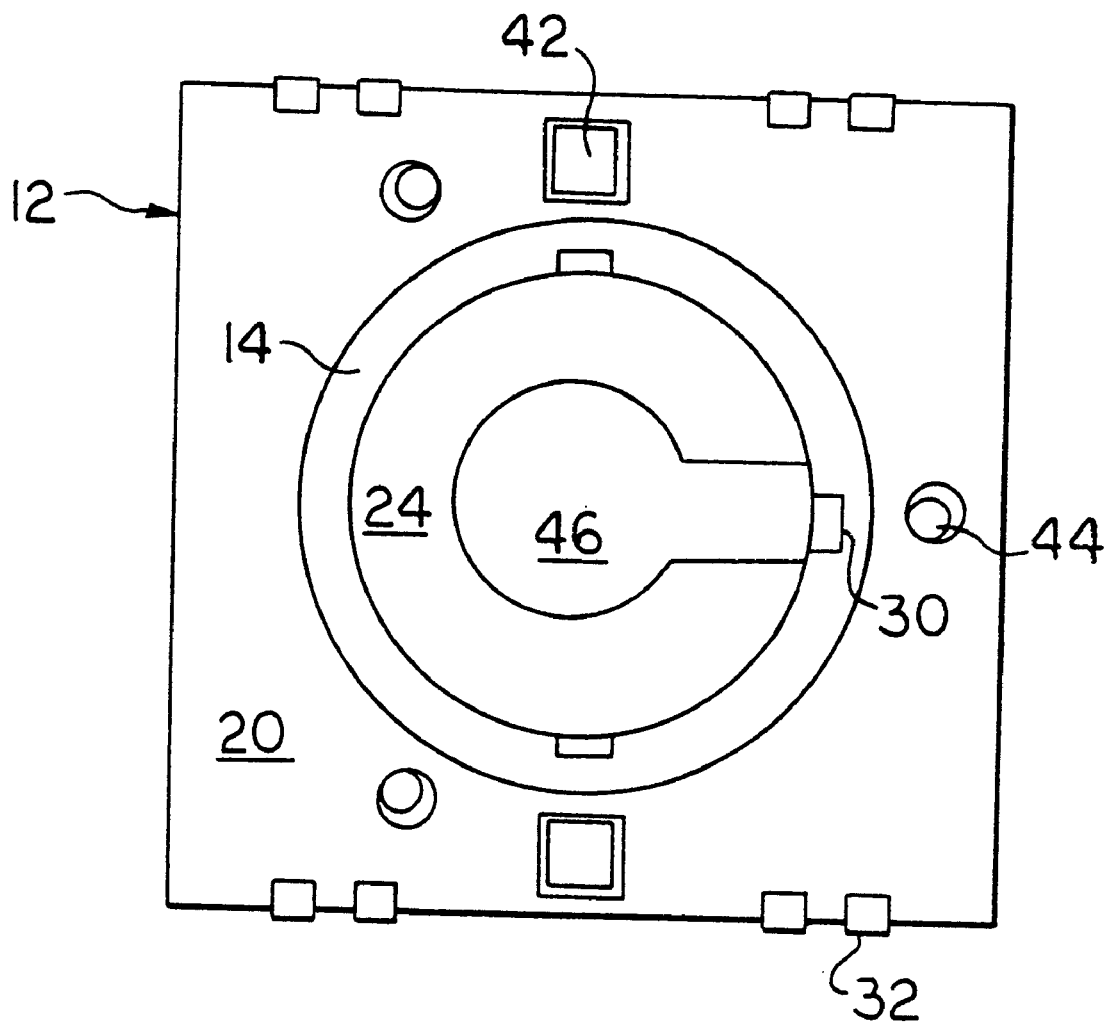
FIG. 2 is a bottom view of the substrate of FIG. 1 with the cover removed.

FIG. 2 shows a bottom view of substrate 12 of FIG. 1 with cover 28 removed. A pair of heater transistors 42 are mounted to dielectric 20 to control the oscillator temperature and a temperature sensor 44 is also mounted to dielectric 20 to control the oscillator temperature. Sensor 44 provides feedback to electrical circuitry 26 which also functions to control heater transistors 42. Circuit lines (not shown) connect transistors 42, sensor 44 and circuitry 26. Crystal 24 has a rounded shape. Crystal 24 has multiple electrodes 46 which are connected to the connectors 30. Connectors 30 and electrodes 46 allow a potential difference to be applied across crystal 24.

Figure 3:
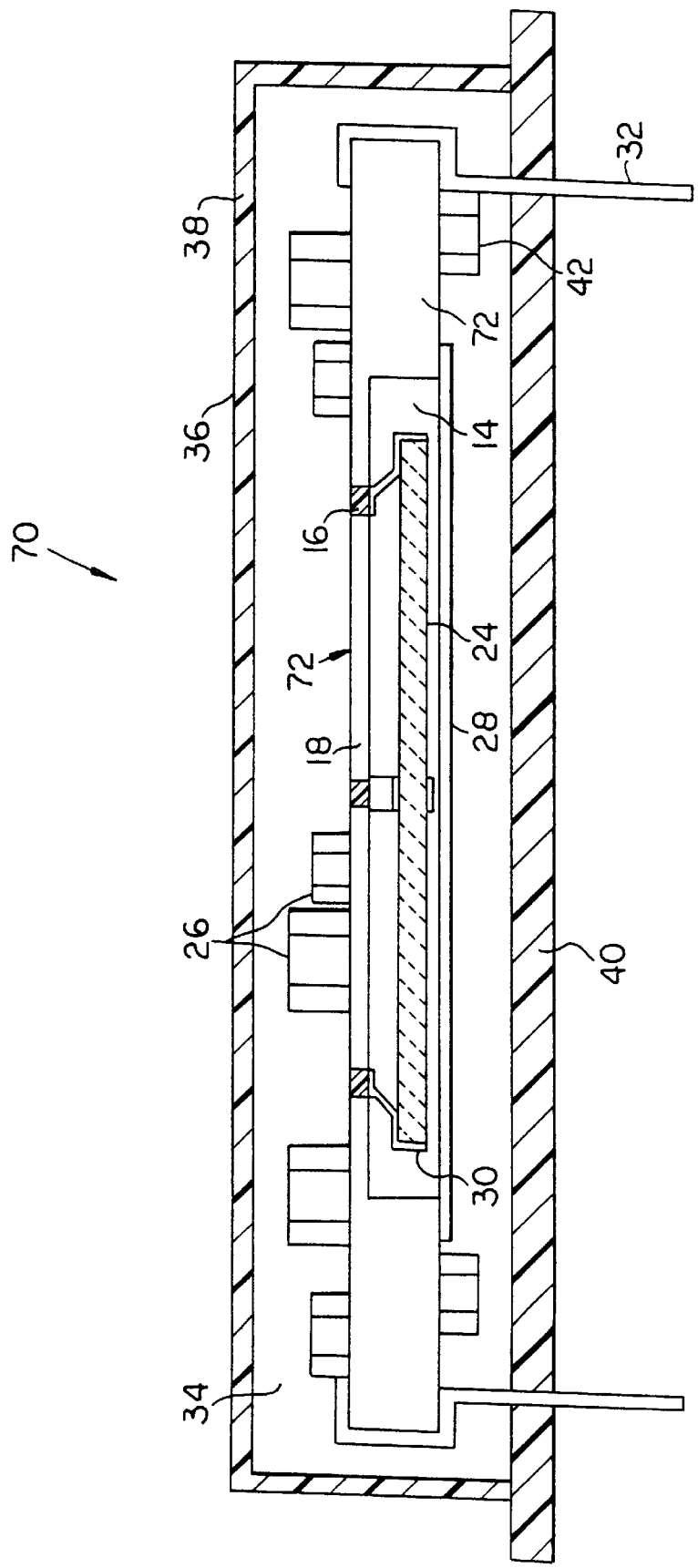
FIG. 3 is a side cross sectional view of the preferred embodiment of a low profile integrated oscillator.

Referring to FIG. 3, a side cross sectional view of the prefer red embodiment, oscillator assembly 70 is shown. FIG. 3 is identical to FIG. 1, except that substrate 72 is now a single piece of thermally conductive ceramic such as aluminum nitride instead of being formed of 3 separate layers of alumina and copper. Aluminum nitride is an excellent conductor of heat and allows the heat generated by heater transistors 42 to be readily transferred into cavity 14.

Oscillator assembly 10 can be assembled as follows: The first step is to assemble substrate 12 from first dielectric 18, second dielectric 20 and core 22 by adhesive joining. Via 16 will have been previously formed in dielectric 18 by conventional thick film conductor processing. Electronic circuitry 26 is placed and soldered on dielectric 18. Similarly, heater transistors 42 and sensors 44 are soldered directly to the thermally conductive core 22. Connectors 30 are attached to vias 16 by conventional soldering or brazing. A conventional quartz crystal 24 is placed on connectors 30 and disposed in cavity 14. Connector 30 is attached to crystal 24 by a conductive epoxy. Metal cover 28 is placed over cavity 14 and attached using an adhesive, solder or welding process. Pins 32 are soldered to substrate 12 and placed through a bottom piece 40. Insulation 34 is applied over substrate 12 and top can 38 is placed over insulation 34 and attached to bottom piece 40 by soldering or crimping. The oscillator assembly 10 is then tested.

Variations of the Preferred Embodiment(s)

One of ordinary skill in the arts of oscillator and crystal design, will realize many advantages from using the preferred embodiment. Further, one of ordinary skill in the art of making oscillators will realize that there are many different ways of accomplishing the preferred embodiment. For example, it is contemplated to make eliminate housing 36 and insulation 34 and mount substrate 12 directly to a printed circuit board. Although electrical circuitry 26 is illustrated above dielectric 18, it could be placed on dielectric 20 or even placed inside cavity 14.

The embodiment shows the use of vias 16 to make an electrical connection between crystal 24 and electrical circuitry 26. Other electrical connections could be used such as pins, edge connectors or cables.

Even though, the embodiment discusses heaters 42 and sensors 44 mounted on dielectric 20, it is contemplated to mount them on dielectric 18 or in cavity 14 or on core 22. Further, it is contemplated to omit heaters 42 and sensors 44.

Even though the embodiment discusses the use of a pair of alumina dielectrics 18 and 20 bonded to a copper core 22 for the substrate 12, one skilled in the art would realize that other substrates could be used such as polyamide films, printed circuit boards, copper invar copper or other ceramics.

Although, oscillator 10 is illustrated in as having pins 32 connecting to electrical circuitry 26, it is contemplated to have a surface mount design in which the pins 32 would not pass completely through the bottom piece 40 and edge castellations would be included to facilitate surface mounting to another printed circuit board.

Further, the crystal 24 could be an inverted mesa type crystal.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by Letters Patent is:

1. An ovenized oscillator operable to provide an oscillator signal, comprising:

a) a planar aluminum nitride substrate having a first surface, an opposed second surface and a cavity located in the second surface, the second surface surrounding the cavity;

b) a plurality of electrically conductive vias passing through the substrate between the first surface and the cavity;

c) a plurality of connectors mechanically and electrically attached to the via and extending into the cavity;

d) a resonator, disposed in the cavity and supported by the connectors for stabilizing the oscillator signal, the resonator electrically connected to the connectors;

e) a cover sealing the resonator in the cavity;

f) a conditioning circuit, located on the first surface and electrically connected to the via, for conditioning the oscillator signal;

g) a transistor heater, located on the second surface, adjacent the cavity and thermally communicated with the cavity through the aluminum nitride substrate for heating the resonator, the heater electrically connected to the conditioning circuit; and h) a temperature sensor, mounted on the second surface, adjacent the cavity and thermally communicated with the cavity through the aluminum nitride substrate for monitoring the resonator temperature, the temperature sensor electrically connected to the conditioning circuit, the conditioning circuit operable to control the heater in response to the temperature sensor.

2. The oscillator according to claim 1, wherein the substrate is surrounded by an insulation and mounted within a housing.

3. An ovenized oscillator operable to provide an oscillator signal, comprising:

a) a planar substrate having a first ceramic dielectric, a second ceramic dielectric and a copper core located between the first and the second dielectric, the substrate further having a cavity, the core and the second ceramic dielectric surrounding the cavity;

b) a plurality of electrically conductive vias passing through the substrate between the first ceramic dielectric and the cavity;

c) a plurality of connectors mechanically and electrically attached to the via and extending into the cavity;

d) a resonator, disposed in the cavity and supported by the connectors for stabilizing the oscillator signal, the resonator electrically connected to the connectors;

e) a cover sealing the resonator in the cavity;

f) a conditioning circuit, located on the first ceramic dielectric and electrically connected to the via, for conditioning the oscillator signal;

g) a transistor heater, located on the second ceramic dielectric, adjacent the cavity and thermally communicated with the cavity through the copper core for heating the resonator, the heater electrically connected to the conditioning circuit; and h) a temperature sensor, mounted on the second ceramic dielectric, adjacent the cavity and thermally communicated with the cavity through the copper core for monitoring the resonator temperature, the temperature sensor electrically connected to the conditioning circuit, the conditioning circuit operable to control the heater in response to the temperature sensor.

4. The oscillator according to claim 3, wherein the substrate is surrounded by an insulation and mounted within a housing.

* * * * *